United States Patent [19]

Uwano et al.

[11] Patent Number: 5,675,613
[45] Date of Patent: Oct. 7, 1997

[54] DISTORTION COMPENSATOR

[75] Inventors: Shuta Uwano, Yokosuka; Kazuji Watanabe, Yokohama, both of Japan

[73] Assignee: Nippon Telegraph & Telephone Corporation, Tokyo, Japan

[21] Appl. No.: 597,441

[22] Filed: Feb. 2, 1996

[30] Foreign Application Priority Data

Feb. 2, 1995 [JP] Japan .................................. 7-016204
Feb. 2, 1995 [JP] Japan .................................. 7-016211

[51] Int. Cl.$^6$ .............................. H03D 1/04; H03D 1/06
[52] U.S. Cl. .......................... 375/346; 375/220; 375/285
[58] Field of Search .............................. 375/346, 220, 375/285, 367, 343

[56] References Cited

U.S. PATENT DOCUMENTS

| | | | |
|---|---|---|---|
| 4,475,215 | 10/1984 | Gutleber | 375/34 |
| 5,260,972 | 11/1993 | Wang | 375/58 |
| 5,537,443 | 7/1996 | Yoshino et al. | 375/340 |

Primary Examiner—Stephen Chin
Assistant Examiner—Mohammad Ghayour
Attorney, Agent, or Firm—Cushman, Darby & Cushman IP Group of Pillsbury Madison & Sutro LLP

[57] ABSTRACT

In order to carry out high-precision control of distortion compensation, a received signal is split into two signals. One of the resulting signals ("the first signal") is provided to a distortion generator with similar characteristics to the distortion produced at the signal transmitting side, and the phase and amplitude of the other of the resulting signals ("the second signal") are controlled. By adding these two signals, the desired signal is suppressed and only the distortion component is extracted. This process is controlled by correlation detection of the desired signal. Next, the distortion component contained in the second signal is removed by controlling the phase and amplitude of this extracted distortion component and adding the result to the second signal. This process is controlled by detecting the correlation between the extracted distortion component and the error component contained in the signal after the addition. This enables compensation for distortion produced at the transmitting side to be performed at the receiving side, so that the size of transmitting equipment can be reduced.

9 Claims, 16 Drawing Sheets

# DISTORTION COMPENSATOR

BACKGROUND OF THE INVENTION

The present invention claims priority from Japanese Patent Application Nos. 7-16204 filed Feb. 2, 1995 and 7-16211 also filed Feb. 2, 1995, the content of both being incorporated herein by reference.

1. Field of the Invention

The present invention pertains to a device that compensates for nonlinear distortions in transmission lines. It is suited for use in optical communications and mobile communication systems.

2. Description of the Related Art

Predistortion is a known technique for compensating for nonlinear distortion. An example of this technique is explained with reference to FIG. 16, which is a block diagram of a conventional device. FIG. 16 shows an access system in which radio base station 3 disposed within radio zone Z receives radio signals from mobile terminals 1 and 2, converts them collectively to an optical signal and transmits this signal to central station 7 via optical fiber transmission line 6. In particular, FIG. 16 shows a configuration wherein predistortion is applied to compensate for the nonlinear distortion produced by electrical-to-optical converter 5 of radio base station 3.

In FIG. 16, radio signals from mobile terminals 1 and 2 received by antenna 4 of radio base station 3 are converted to intermediate frequency signals by frequency converter FC, input to electrical-to-optical converter 5, and transmitted to central station 7 via optical fiber transmission line 6. During this process, nonlinear distortion is produced by electrical-to-optical converter 5 of radio base station 3.

The signal from frequency converter FC is split by divider 74 prior to being input to electrical-to-optical converter 5. One of the resulting signals is input to pseudo-distortion generator 75 and after distortion has been added, the phase and amplitude of this distortion are adjusted by variable phase shifter 76 and variable attenuator 77 to give an equal amplitude and an opposite phase to that of the distortion component produced by electrical-to-optical converter 5. The other output signal from divider 74 is delayed by delay element 78. The two signals are combined in adder 79 and input to electrical-to-optical converter 5, thereby cancelling the distortion in the output of electrical-to-optical converter 5.

The output signal from electrical-to-optical converter 5 is transmitted to central station 7 via optical fiber transmission line 6, and then converted to an electrical signal by optical-to-electrical converter 8. The output of optical-to-electrical converter 8 is input to phase demodulators $100_1$ and $100_2$ via branch filter 82. The phase demodulators $100_1$ and $100_2$, respectively, correspond to mobile terminals 1 and 2. A detailed explanation of the predistortion method outlined here can be found, for example, in the article T. Nojima and Y. Okamoto entitled, "Predistortion nonlinear compensator for microwave SSB-AM system." in ICC '80 Conf. Rec., Vol.2 June 1980, pp33.2.1–33.2.6; and the article by T. Nojima and T. Conno entitled, "Cuber predistortion liniearizer for relay equipment in 800 MHz band land mobile telephone system." IEEE Trans. Vehicular Tech., Vol. VT-34, pp169–177, Nov. 1985.

In the predistortion method taught in examples such as these, in order to increase the distortion compensation capability, the phase and amplitude of the output signal of pseudo-distortion generator 75 has to be controlled automatically. However, control methods employed to date have been based on perturbation and have not been accurate.

Another problem that has been encountered with conventional predistortion methods is that when compensating for distortion of a broadband signal comprising a plurality of radio carriers, a plurality of predistortion circuits are required in order to compensate for nonlinear distortion at the transmitting side, which has led to further increases in the size of circuits in the radio base stations on the transmitting side.

SUMMARY OF THE INVENTION

The present invention has been devised in light of the problems with conventional devices discussed above, and its object is to provide a distortion compensator capable of performing high-precision control of distortion compensation. It is a further object of this invention to provide a receiving device capable of controlling the distortion compensation of broadband signals comprising a plurality of radio carriers. It is yet another object of this invention to provide a central station device which compensates at the receiving side for distortion produced at the transmitting side, which thereby enabling the transmitting equipment to be made smaller. It is still another object of this invention to provide a radio communication system which compensates for distortion of a broadband signal comprising a plurality of radio carriers, the distortion having been produced at the transmitting side, to be accurately controlled at the receiving side, which thereby also enables the transmitting equipment to be made smaller.

According to a first aspect, this invention pertains to a distortion compensator having a pseudo-distortion generator to which a digitally multiplexed quadrature phase modulated intermediate frequency signal containing odd order distortion is input. The intermediate frequency signal passes therethrough and is set to be equivalent to the source of the aforementioned odd order distortion. A first phase and amplitude varying circuit also receives the intermediate frequency signal. A first adder essentially subtracts the output of the first phase and amplitude varying circuit from the output of the aforementioned pseudo-distortion generator. A second phase and amplitude varying circuit receives the output of first adder. A second adder adds the output of the second phase and amplitude varying circuit and the aforementioned intermediate frequency signal so as to eliminate the aforementioned odd order distortion. An error detection circuit extracts the error component from the output of the second adder.

The distortion compensator also includes a first correlation detector which calculates the correlation between the aforementioned intermediate frequency signal and the output of the aforementioned first adder, and outputs a signal corresponding to this correlation that is used to control the amount of phase shift and the amplitude of the aforementioned first phase and amplitude varying circuit so that this correlation is minimized. A second correlation detector calculates the correlation between the output of the aforementioned first adder and the error component that is output from the aforementioned error detection circuit, outputs a signal corresponding to this correlation that is used to control the amount of phase shift and the amplitude of the aforementioned second phase and amplitude varying circuit so that this correlation is minimized. This enables optimum distortion compensation characteristics to be obtained for an input signal. It is further desirable to have the following: a first phase demodulator to which the output of the aforementioned second adder is supplied; second phase demodulator to which the aforementioned intermediate frequency signal is supplied; and third phase demodulator to which the output of the aforementioned first adder is supplied. It is also desirable for the aforementioned first correlation detector to include a means for calculating the correlation between the output of the third phase demodulator and the output of the aforementioned second phase demodulator, and which controls the amount of phase shift and the amplitude of the aforementioned first phase and amplitude varying circuit so that this correlation is minimized; and for the aforementioned second correlation detector to comprise a means which calculates the correlation between the output of the aforementioned third phase demodulator and the output of the aforementioned first phase demodulator, and which controls the amount of phase shift and the amplitude of the aforementioned second phase and amplitude varying circuit so that this correlation is minimized.

The aforementioned first and/or the aforementioned second phase and amplitude varying circuit can also comprise a transversal filter. This enables changes in signal characteristics to be compensated for, and enables even better distortion compensation characteristics to be obtained.

Another configuration which may be adopted is to have a first phase demodulator to which is supplied the intermediate frequency signal, and to the output terminals of which are connected the aforementioned first phase and amplitude varying circuit and the aforementioned second adder. A second phase demodulator can be inserted between the aforementioned pseudo-distortion generator and the aforementioned first adder. In this case, the aforementioned first and/or the aforementioned second phase and amplitude varying circuit can also comprise a transversal filter.

According to a second aspect, this invention pertains to a receiving device characterized in that it has branch filter to which is input an intermediate frequency signal comprising digitally multiplexed quadrature phase modulated signals that have been frequency multiplexed onto a large number of carriers. The branch filter splits this input into a digitally multiplexed quadrature phase modulated intermediate frequency signal corresponding to each carrier. The aforementioned distortion compensator is provided for each respective carrier. This enables optimum distortion compensation characteristics to be obtained for each carrier.

An alternative configuration is for the pseudo-distortion generator, which allocates pseudo-distortion to the aforementioned distortion compensator, to be common to the distortion compensators that are provided for each respective carrier. This makes it unnecessary to provide a pseudo-distortion generator for each and every distortion compensator, thereby simplifying the circuit configuration.

According to a third aspect, this invention pertains to a central station device characterized in that it has optical-to-electrical converter to which is input an optical multiplexed signal, and the electrical signal output of which is connected to the input of the aforementioned branch filter in the aforementioned receiving device. This enables distortion produced at the transmitting side to be removed at the receiving side, thereby enabling the hardware of the transmitting side device to be made smaller.

According to a fourth aspect, this invention pertains to a radio communications system characterized in that it has a radio base station device which is connected to a large number of mobile terminals by radio channels. The radio base station device includes a frequency converter which converts the signals received from this large number of mobile terminals to intermediate frequencies, and electrical-to-optical converter which converts the intermediate frequency signals output from the frequency converter to optical signals. The optical signal that is output from the aforementioned electrical-to-optical converter is connected, by means of optical transmission line, to the input of the aforementioned optical-to-electrical converter, which is provided in the aforementioned central station device. Because distortion produced at a radio base station can be removed at the central station, this arrangement enables the radio base station to be reduced in size. It also enables distortion to be removed efficiently.

An important characteristic of this invention is that optimum distortion compensation is carried out by forming feedback loops from the correlation detectors. That is to say, this invention is based on a technical idea which is different from the distortion compensator having a feedforward configuration such as that described on p.168 of the article by Muroya and Yamamoto entitled, "Digital Radio Communications", pub. Sangyo Tosho, August 1985. Because a feedback loop is formed, this invention is capable of following changes in distortion characteristics and adjusting the amount of phase shift and the amplitude of the pseudo-distortion so that optimum distortion compensation can be carried out.

The received signal is split into two signals i.e., a first signal and a second signal. One of the resulting signals ("the first signal") is passed to a pseudo-distortion generator with the same characteristics as the distortion produced at the transmitting side. The phase and amplitude of the other of the resulting signals ("the second signal") are controlled. By adding these two signals, the desired signal is suppressed and only the distortion component is extracted. This process is controlled by detecting correlation with the desired signal.

Next, the distortion component contained in the second signal is removed by controlling the phase and amplitude of this extracted distortion component and adding the result to the second signal. This process is controlled by detecting the correlation between the extracted distortion component and the error component remaining after the addition. This enables optimum distortion compensation characteristics to be obtained for the signal that has been input thereto.

The distortion compensation effect can be further improved by taking the frequency characteristics of the desired signal and the distortion component into consideration and using transversal filters to suppress the desired signal and remove the distortion.

Thus, when, for example, broadband signals comprising a plurality of radio carriers are transmitted collectively, non-linear distortion produced by amplifying elements, mixers, electrical-to-optical converters and so forth at the transmitting side will be compensated for at the receiving side separately for each carrier. Moreover, because correlation detection is used as the control method, the distortion component is accurately extracted, and the distortion component in the desired signal can be eliminated using this.

Furthermore, when broadband signals comprising a plurality of radio carriers are transmitted collectively, nonlinear distortion produced by amplifying elements, mixers, electrical-to-optical converters and so forth at the transmitting side can be compensated for at the receiving side separately for each carrier by using a plurality of receiving devices each containing this distortion compensator.

As has been explained above, this invention provides a distortion compensator capable of performing high-precision control of distortion compensation. It also provides a receiving device capable of controlling the distortion compensation of broadband signals comprising a plurality of radio carriers. It also provides a central station device which enables distortion produced at the transmitting side to be compensated for at the receiving side, and which thereby enables the transmitting device to be made smaller. It can also provide a radio communications system which enables compensation for distortion of broadband signals comprising a plurality of radio carriers, the distortion having been produced at the transmitting side, to be accurately controlled at the receiving side, and which thereby enables the transmitting device to be made smaller.

One of the present inventors has disclosed an interference compensator in a prior application (U.S. Pat. No. 5,046,133 and European Patent 0331411A2). Although some of the techniques of the present invention are on a par with those disclosed in these patents, the present invention does not relate to the previously disclosed removal of an interfering wave. Instead, it is designed to remove odd order distortion produced by the nonlinearity of certain elements. It, therefore, differs from this prior application in that it has a unique pseudo-distortion generator and removes distortion produced by elements within the system.

Other objects, features and characteristics of the present invention as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures.

DETAILED DESCRIPTION OF THE PRESENTLY PREFERRED EMBODIMENTS

Figure 1:
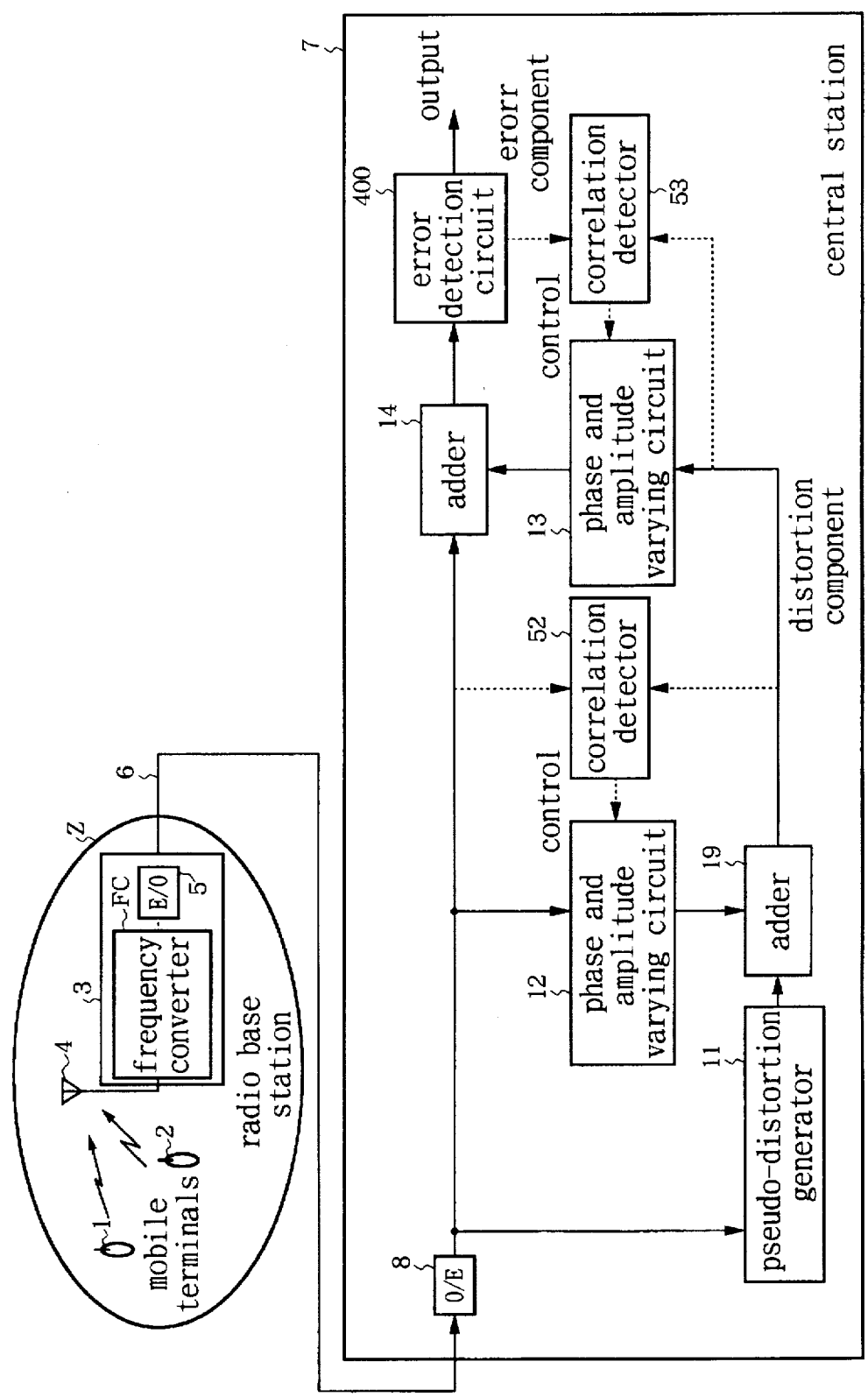
FIG. 1 is a block diagram of the present invention.

The configuration of embodiments of this invention will be explained with reference to FIG. 1, which is a block diagram of the embodiments.

This invention is a distortion compensator characterized in that it includes a pseudo-distortion generator 11 to which is input a digitally multiplexed quadrature phase modulated intermediate frequency signal containing odd order distortion. The intermediate frequency signal passes therethrough and is set to be equivalent to the source of the aforementioned odd order distortion. A phase and amplitude varying circuit 12 also receives the intermediate frequency signal passes. Adder 19 essentially subtracts the output of phase and amplitude varying circuit 12 from the output of pseudo-distortion generator 11. A phase and amplitude varying circuit 13 receives the output of adder 19 passes. Adder 14 adds the output of phase and amplitude varying circuit 13 and the aforementioned intermediate frequency signal so as to eliminate the aforementioned odd order distortion. An error detection circuit 400 which extracts the error component from the output of adder 14. A correlation detector 52 calculates the correlation between the aforementioned intermediate frequency signal and the output of adder 19, and controls the amount of phase shift and the amplitude of phase and amplitude varying circuit 12 so that this correlation is minimized. A correlation detector 53 calculates the correlation between the output of adder 19 and the error component that is output from error detection circuit 400, and controls the amount of phase shift and the amplitude of phase and amplitude varying circuit 13 so that this correlation is minimized.

Embodiments of this invention are constituted as a radio communications system which includes radio base station 3 which is connected to mobile terminals 1 and 2 by radio channels, the radio base station 3 having frequency converter FC which converts radio signals from these mobile terminals 1 and 2 to intermediate frequencies, and electrical-to-optical converter 5 which converts the intermediate frequency signals output from this frequency converter FC to optical signals. The optical signal that is output by electrical-to-optical converter 5 is connected by optical fiber transmission line 6 to the input of optical-to-electrical converter 8 which is provided in central station 7.

(FIRST EMBODIMENT)

The constitution of a first embodiment of this invention will be explained with reference to FIG. 2, which is a block diagram of the first embodiment.

The first embodiment of the invention includes a divider 9 to which is input the digitally multiplexed quadrature phase modulated intermediate frequency signal containing odd order distortion, and which splits this intermediate frequency signal into two. Divider 10 further splits one of the outputs of divider 9 into two. A pseudo-distortion generator 11 receives one of the outputs of divider 10 passes, and which has been set to be equivalent to the source of the aforementioned odd order distortion. A phase and amplitude varying circuit 12 receives the other output of divider 10 passes. Adder 19 essentially subtracts the output of phase and amplitude varying circuit 12 from the output of pseudo-distortion generator 11. A phase and amplitude varying circuit 13 receives the output of adder 19 passes. Adder 14 adds the output of phase and amplitude varying circuit 13 and the other output of divider 9 so that the aforementioned odd order distortion is eliminated. A phase demodulator 100 receives the output of the adder 14. A phase demodulator 101 receives the other output of divider 10. A phase demodulator 105 receives the output of adder 19. Correlation detector 52 calculates the correlation between the output of phase demodulator 105 and the output of phase demodulator 101, and controls the amount of phase shift and the amplitude of phase and amplitude varying circuit 12 so that this correlation is minimized. Correlation detector 53 calculates the correlation between the output of phase demodulator 105 and the error component in the output of phase demodulator 100, and controls the amount of phase shift and the amplitude of phase and amplitude varying circuit 13 so that this correlation is minimized.

Figure 2:
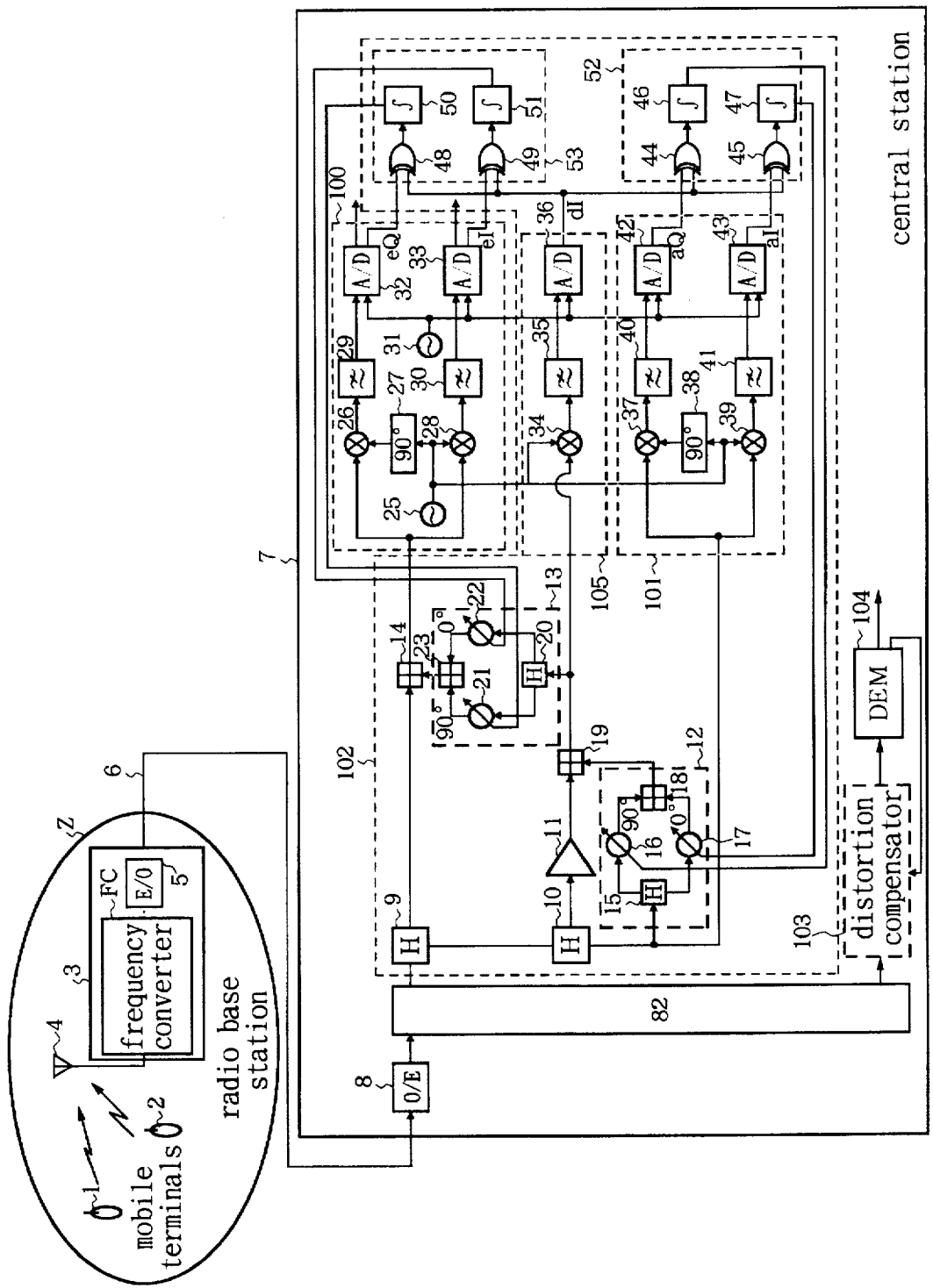
FIG. 2 is a more detailed diagram of a first embodiment of this invention.

Error detection circuit 400 shown in FIG. 1 is not specifically mentioned in this first embodiment illustrated in FIG. 2 because error components are extracted from the output of AD converters 32 and 33 of phase demodulator 100 by using bits from positions corresponding to the error component. Accordingly, in this first embodiment of the invention, although error detection circuit 400 is not specifically used, error components are extracted by selecting particular bit positions in the output of AD converters 32 and 33.

Figure 3:
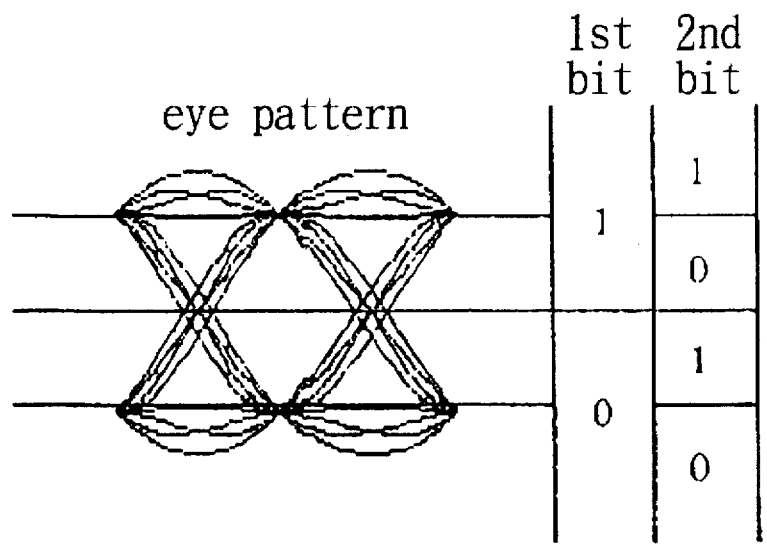
FIGS. 3a, 3b serves to explain error components.
Figure 3:
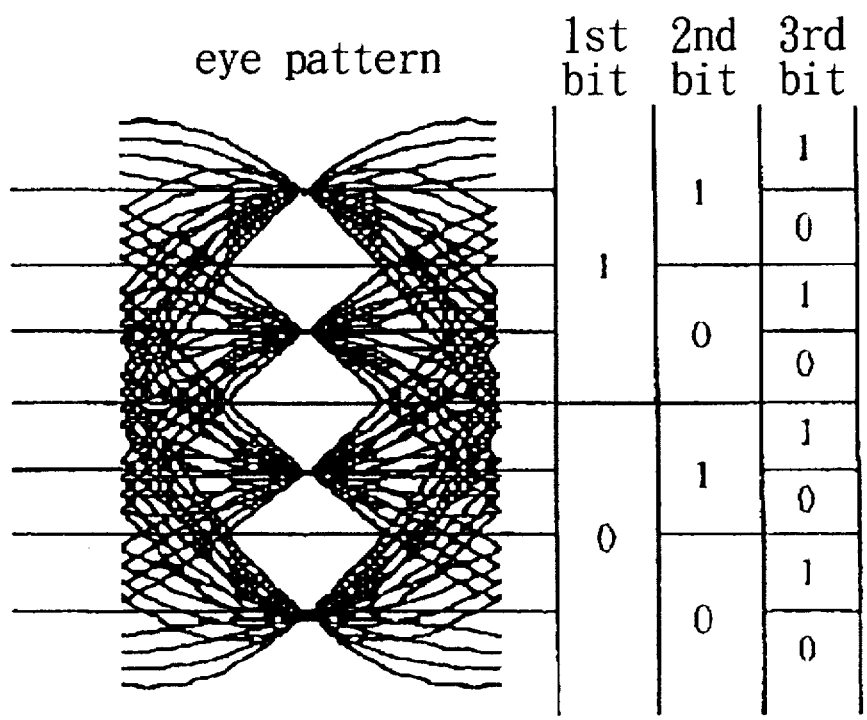

FIGS. 3(a) and 3(b) explain the error components. FIG. 3(a) shows the eye pattern of the output of AD converters 32 and 33 when the modulation scheme is 4 PSK. In this case, the second bit becomes the error component. FIG. 3(b) shows the eye pattern of the output of AD converters 32 and 33 when the modulation scheme is 16 QAM, and in this case the third bit constitutes the error component.

Figure 4:
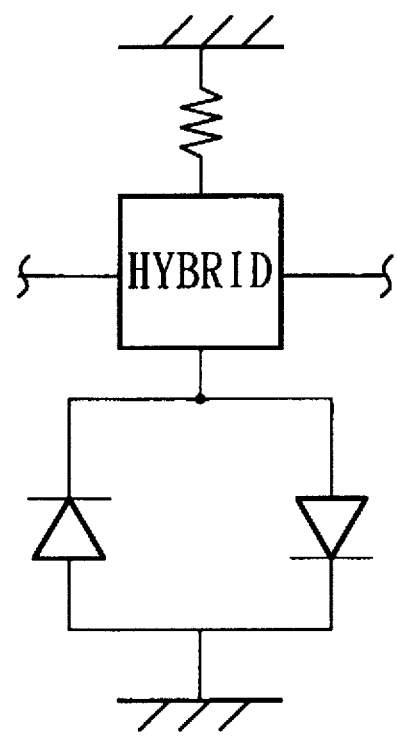
FIG. 4 shows a pseudo-distortion generator.

In pseudo-distortion generator 11, pseudo-distortion with the same characteristics as the distortion to be removed can be produced by simply using a device which is equivalent to electrical-to-optical converter 5 used in the radio base station. It is also feasible to use a diode pair based pseudo-distortion generator of the sort shown in FIG. 4, which is a pseudo-distortion generator that is based on known technology.

Next, the operation of this first embodiment of the present invention will be explained. In FIG. 2, radio signals from mobile terminals 1 and 2 that have been received by antenna 4 of radio base station 3 are converted to intermediate frequency signals by frequency converter FC and the resulting signals are input to electrical-to-optical converter 5, whereupon they are transmitted to central station 7 via optical fiber transmission line 6. During this process, non-linear distortion is produced by electrical-to-optical converter 5 of radio base station 3.

After the optical signal received at central station 7 has been converted to an electrical signal by optical-to-electrical converter 8, it is divided by branch filter 82 into a path to phase demodulator 100 which corresponds to mobile terminal 1, and a path to phase demodulator 104 which corresponds to mobile terminal 2. Because the following configuration is the same for both paths, only one path will be explained. The output of branch filter 82 is split into two paths by divider 9, and one path is split again into two paths by divider 10. One of the outputs of divider 10 is input to pseudo-distortion generator 11, and after pseudo-distortion has been added, the result is input to adder 19. The other output of divider 10 is input to phase and amplitude varying circuit 12.

Figure 5:
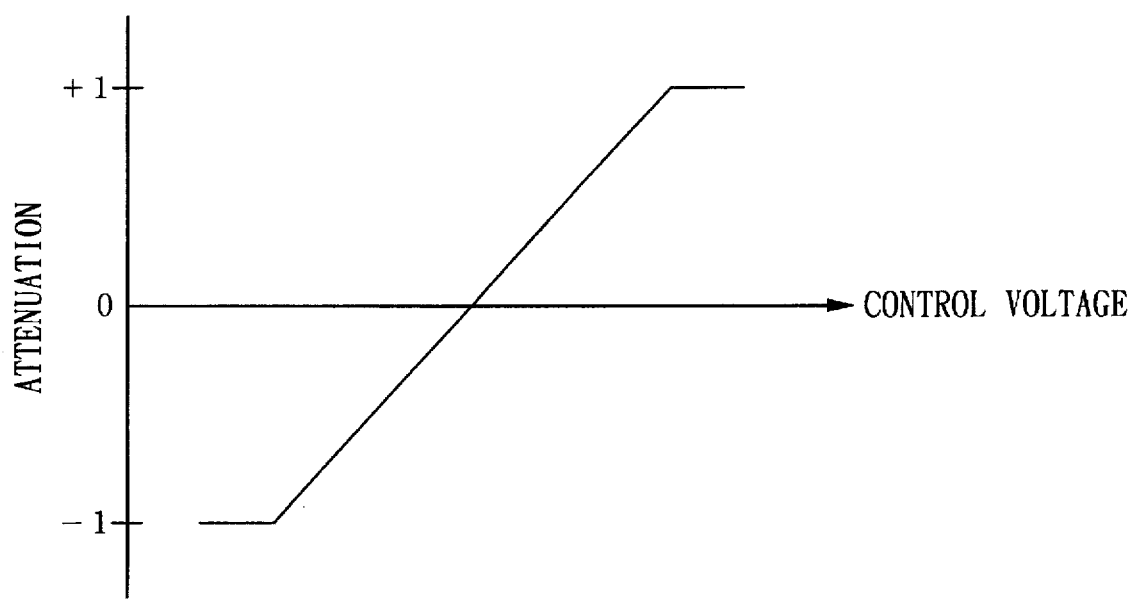
FIG. 5 shows the characteristics of a bipolar variable attenuator.

Phase and amplitude varying circuit 12 comprises divider 15 which splits the input signal, bipolar variable attenuators 16 and 17 which are connected to the output of this divider 15, and 90° coupler 18 which couples and outputs the respective output signals of bipolar variable attenuators 16 and 17. FIG. 5 shows the characteristics of a bipolar variable attenuator. From FIG. 5 it can be appreciated that such a device provides attenuation over both polarities as a function of the control voltage. Bipolar variable attenuator 16 is controlled by the output of integrating circuit 46 (to be described below) and bipolar variable attenuator 17 is controlled by the output of integrating circuit 47. The attenuation characteristics of bipolar variable attenuators 16 and 17 vary according to the control inputs from integrating circuits 46 and 47, and their output signals are coupled by 90° coupler 18. The phase and amplitude of this coupled output signal can therefore be controlled by adjusting the amount of attenuation applied by bipolar variable attenuators 16 and 17. Because the technique for adjusting phase and amplitude using phase and amplitude varying circuits 12 and 13 is well known, a more detailed explanation need not be given.

The signal that is input to phase and amplitude varying circuit 12 is output after its amplitude and phase are adjusted so that the desired signal component in it becomes equal in amplitude and opposite in phase to the desired signal in the output of pseudo-distortion generator 11. The output of phase and amplitude varying circuit 12 is input to adder 19 and added to the output of pseudo-distortion generator 11, whereby the desired signal is suppressed and only the distortion component is extracted.

The output of adder 19 is input to phase and amplitude varying circuit 13. In a similar manner to phase and amplitude varying circuit 12, phase and amplitude varying circuit 13 comprises divider 20, bipolar variable attenuators 21 and 22, and 90° coupler 23. Bipolar variable attenuator 21 is controlled by the output of integrating circuit 50 (to be described below) and bipolar variable attenuator 22 is controlled by the output of integrating circuit 51.

The extracted distortion component, which is input to phase and amplitude varying circuit 13, is output after its amplitude and phase have been adjusted so as to become equal in amplitude and opposite in phase to the distortion component in the output of divider 9. The output of phase and amplitude varying circuit 13 is input to adder 14 and is added to the output of divider 9, whereby the distortion component is eliminated.

The output of adder 14 is input to phase demodulator 100 for demodulating the desired signal. In phase demodulator 100, in-phase and quadrature baseband signals are obtained by using reference carrier 25, which is recovered from the desired signal, for quadrature phase detection of the input signal by 90° phase shifter 27 and phase detectors 26 and 28, and passing the outputs of these to low-pass filters 29 and 30, respectively. The baseband signals obtained are input to AD converters 32 and 33, whereupon digital signals are obtained by sampling using recovered clock signal 31. Error signals eI and eQ are obtained from these in-phase and quadrature digital signals.

The signal that is output from adder 19 is also input to phase detector 34 where it is detected using aforementioned reference carrier 25. It is then passed through low-pass filter 35, whereupon an in-phase baseband signal is obtained. After this baseband signal has been input to AD converter 36, it is sampled by aforementioned clock signal 31, whereupon it becomes digital signal dI.

The signal that is output from divider 10 is also input to phase demodulator 101. In phase demodulator 101, in-phase and quadrature baseband signals are obtained by using aforementioned reference carrier 25 for quadrature phase detection of the input signal by 90° phase shifter 38 and phase detectors 37 and 39, and passing the outputs of these to low-pass filters 40 and 41, respectively. The baseband signals obtained are input to AD converters 42 and 43, whereupon digital signals aQ and aI are obtained, these having been sampled using aforementioned clock signal 31.

Bipolar attenuators 16 and 17 of phase and amplitude varying circuit 12 are controlled as follows. Correlations between (a) in-phase and quadrature digital signals aI and aQ obtained by passing the input signal to phase and amplitude varying circuit 12 through phase demodulator 101, and (b) in-phase digital signal dI obtained from the signal that is output from adder 19, are detected by passing these signals to exclusive-OR circuits 44 and 45 and integrating circuits 46 and 47. Bipolar variable attenuators 16 and 17 are feedback-controlled so that these correlations are minimized. This reduces the residual desired signal in the output of adder 19 to a minimum.

Bipolar attenuators 21 and 22 of phase and amplitude varying circuit 13 are controlled as follows. Correlations between (a) error signals eI and eQ obtained from the in-phase and quadrature digital signals that are output from phase demodulator 100, and (b) in-phase digital signal dI obtained from the signal that is output from adder 19, are detected by passing these signals to exclusive-OR circuits 48 and 49 and integrating circuits 50 and 51. Bipolar variable attenuators 21 and 22 are feedback-controlled so that these correlations are minimized. This reduces the distortion component in the output of adder 14 to a minimum.

(SECOND EMBODIMENT)

Figure 6:
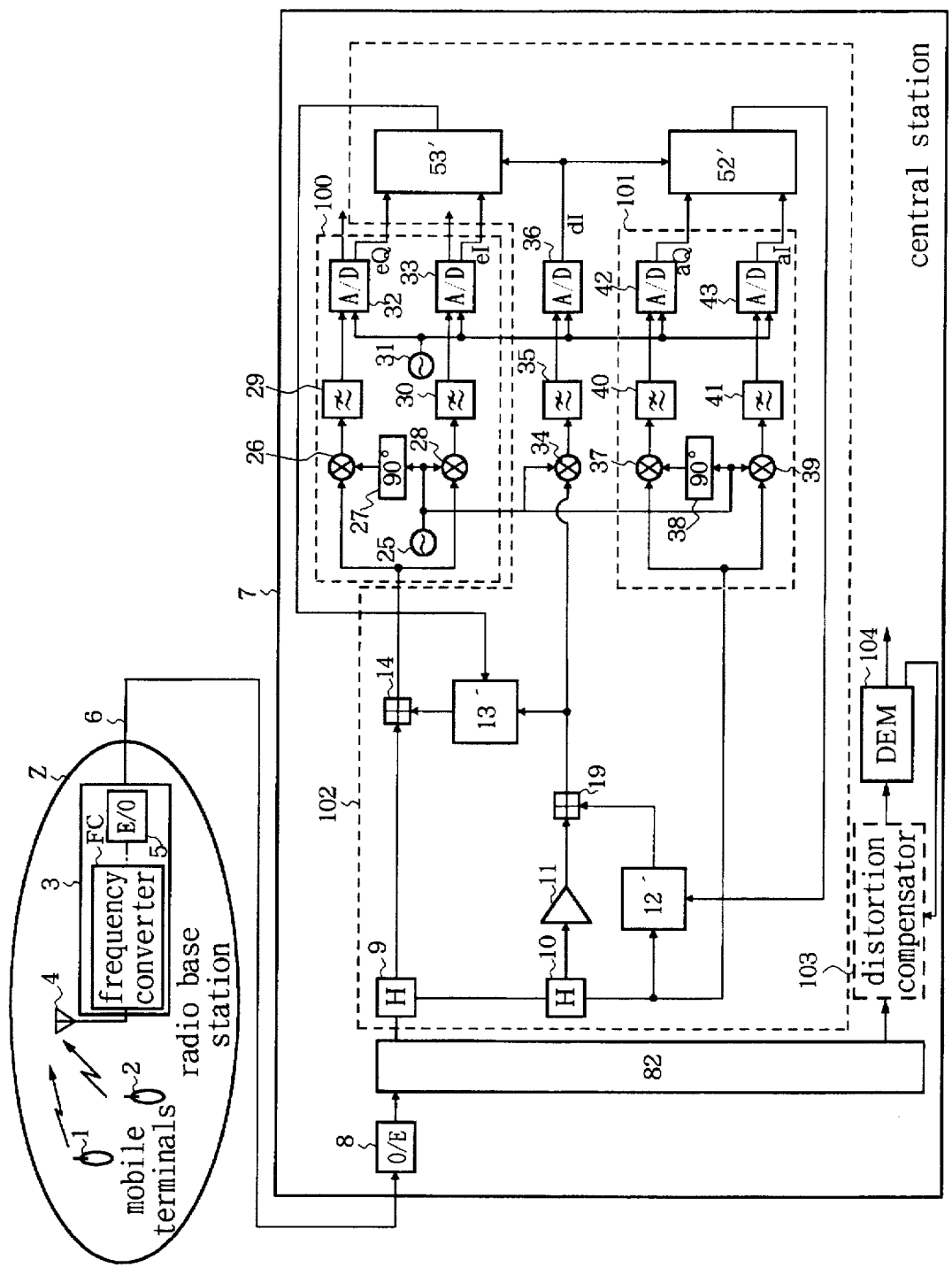
FIG. 6 is a block diagram of a second embodiment of this invention.

Next, a second embodiment of the present invention will be explained with reference to FIG. 6, which is a block diagram of the second embodiment. The main points in which this second embodiment differs from the first embodiment are as follows: (a) two-dimensional transversal filters 12' and 13' having a plurality of taps and operating in the IF band are used where phase and amplitude varying circuits 12 and 13 were used in the first embodiment; (b) transversal filters 12' and 13' are controlled by correlation detectors 52' and 53'. This second embodiment deals with the case where the compensation takes into consideration the frequency characteristics of the broadband desired signal and of the distortion component.

Figure 7:
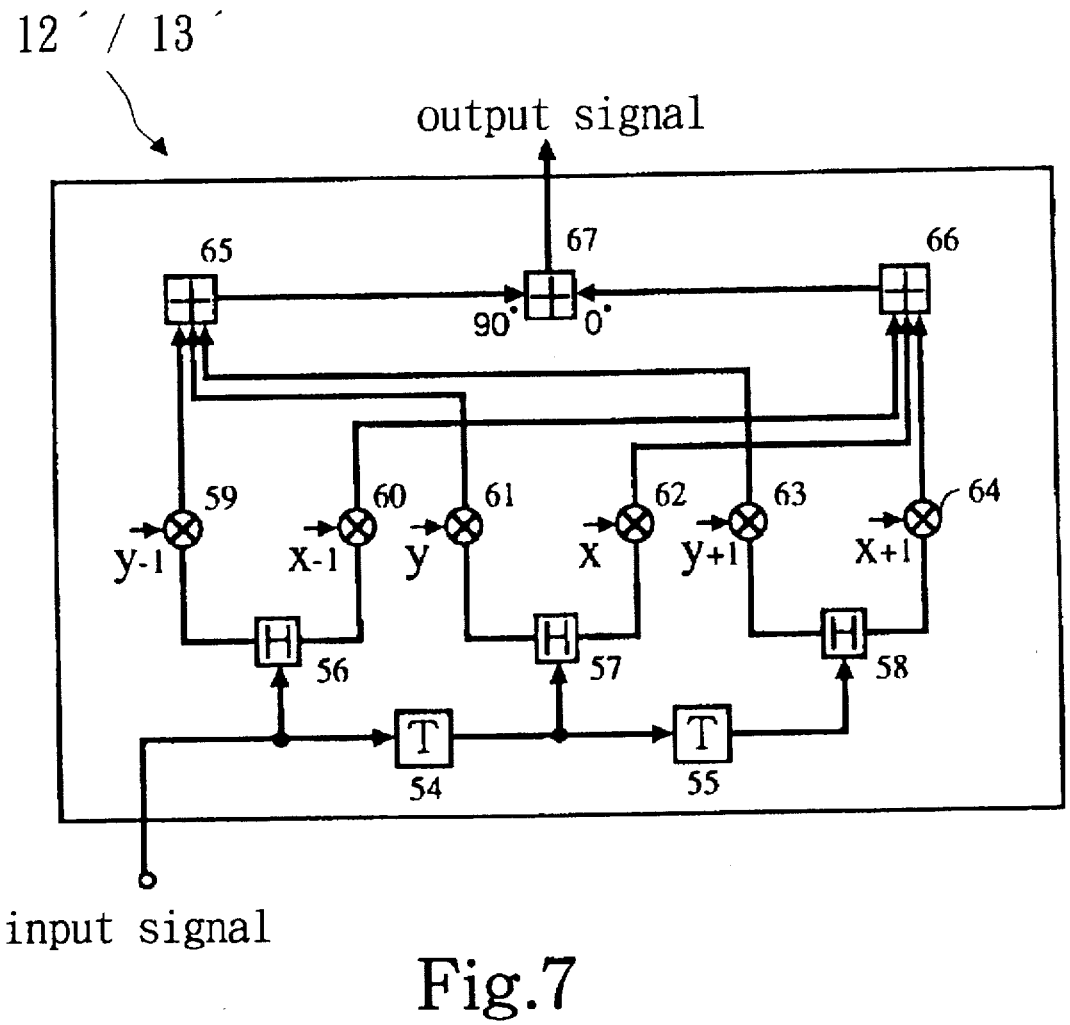
FIG. 7 is a block diagram of a transversal filter in the second embodiment of this invention.

FIG. 7 is a block diagram of transversal filters 12' and 13' (for the case where there are three taps). Transversal filters 12' and 13' include delay circuits 54 and 55, each of which causes the input signal to be delayed by a clock period T; dividers 56, 57 and 58; bipolar variable attenuators 59–64, which are connected to dividers 56, 57 and 58; coupler 65 which couples the respective outputs of bipolar variable attenuators 59, 61 and 63; coupler 66 which couples the respective outputs of bipolar variable attenuators 60, 62 and 64; and 90° coupler 67, which couples the outputs of couplers 65 and 66 and supplies this as output.

Figure 8:
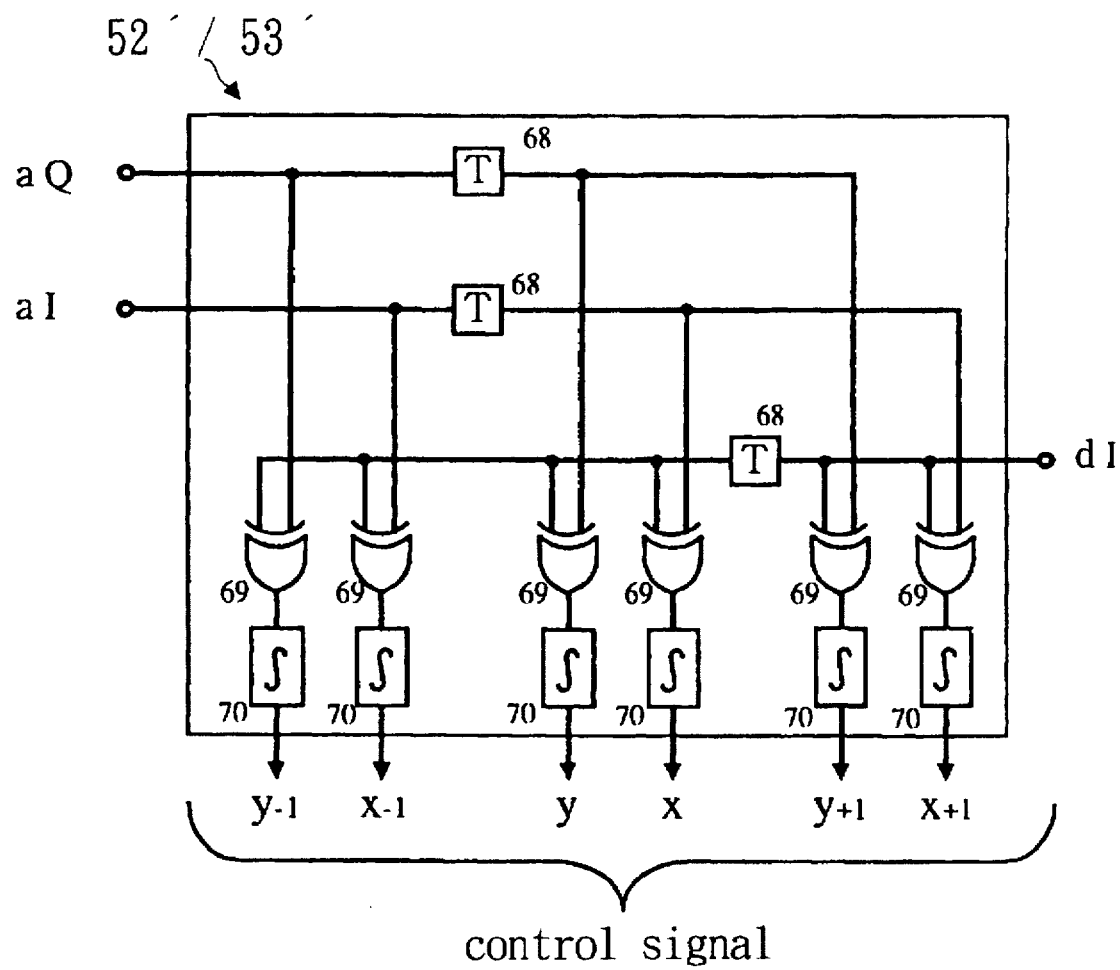
FIG. 8 is a block diagram of a correlation detector in the second embodiment of the invention.

FIG. 8 is a block diagram of correlation detectors 52' and 53' which control transversal filters 12' and 13'. An explanation will be given here of correlation detector 52'. Input signals aI and aQ and digital signal dI are time-aligned by delay circuits 68, operated on by exclusive-OR circuits 69, and input to integrating circuits 70. Correlation with the desired signal is detected by each integrating circuit 70, and control signals y+1, x−1, y, x, y+1 and x+1 are formed for bipolar variable attenuators 59–64 of transversal filter 12' so that this correlation is minimized. These control signals are supplied to bipolar variable attenuators of transversal filter 12', thereby giving feedback control.

The use of transversal filter 12' and correlation detector 52' instead of phase and amplitude varying circuit 12 and correlation detector 52 of the first embodiment mean that even if the frequency characteristics of the desired signal have changed, transversal filter 12' alter the frequency characteristics of the signal that is input to it, thereby making it equivalent to the output of pseudo-distortion generator 11, with the result that the desired signal can be suppressed and the distortion component extracted.

The use of transversal filter 13' and correlation detector 53' (these having the same configuration as described above) instead of phase and amplitude varying circuit 13 and correlation detector 53 of the first embodiment mean that even if the frequency characteristics of the distortion component that has been extracted by adder 19 differ from the frequency characteristics of the distortion component contained in the output of divider 9, they can be made equivalent by means of transversal filter 13', with the result that the distortion component can be eliminated.

(THIRD EMBODIMENT)

Figure 9:
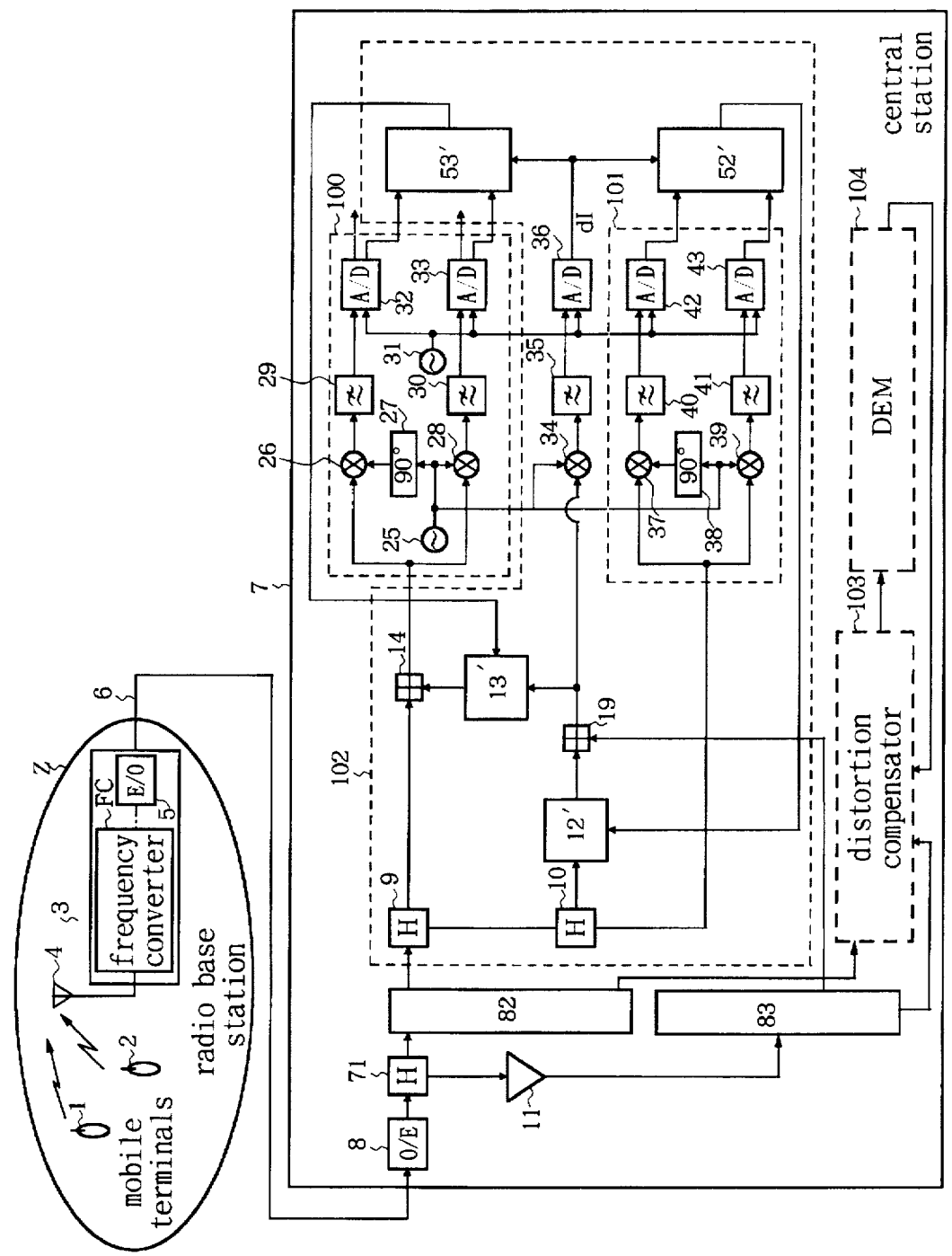
FIG. 9 is a block diagram of a third embodiment of this invention.

Next, a third embodiment of this invention will be explained with reference to FIG. 9, which is a block diagram of the third embodiment. The third embodiment of the invention differs from the first and second embodiments in that divider 71 is provided before branch filter 82, and the signal to which pseudo-distortion has been added by pseudo-distortion generator 11, having been branched off by divider 71, is split by branch filter 83 for the pseudo-distortion into a path to phase demodulator 100 which corresponds to mobile terminal 1, and a path to phase demodulator 104 which corresponds to mobile terminal 2. In the first and second embodiments of this invention, distortion was produced in two paths, whereas a configuration according to this third embodiment of the invention enables the output of pseudo-distortion generator 11 to be shared by two paths.

(FOURTH EMBODIMENT)

Figure 10:
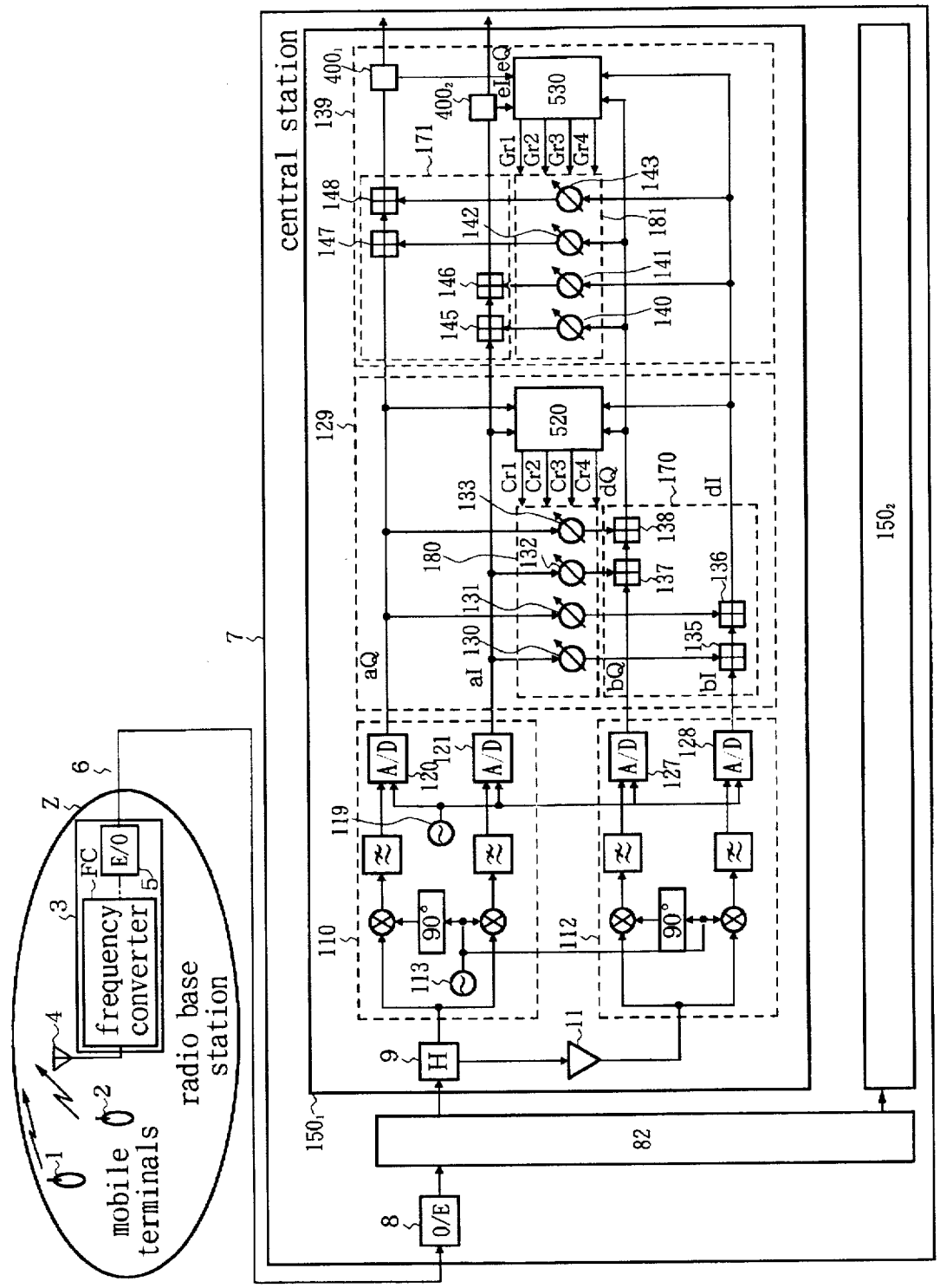
FIG. 10 is a block diagram of a fourth embodiment of this invention.

The configuration of a fourth embodiment of this invention will be explained with reference to FIG. 10, which is a block diagram of the fourth embodiment.

The fourth embodiment of this invention includes a divider 9 to which is input a digitally multiplexed quadrature phase modulated intermediate frequency signal containing odd order distortion, and which splits this intermediate frequency signal into two. Phase demodulator 110 receives one of the outputs of divider 9. Pseudo-distortion generator 11 receives the other of the outputs of divider 9 and which is set to be equivalent to the source of the aforementioned odd order distortion. Phase demodulator 112 receives the output of pseudo-distortion generator 11. Adder 170 essentially subtracts the output of phase demodulator 110 from the output of phase demodulator 112. Adder 171 adds the output of adder 170 and the output of phase demodulator 110 so as to eliminate the aforementioned odd order distortion. Attenuator 180 provided at the input terminal of adder 170 and to which the output of phase demodulator 110 is input, which adjusts the input level to adder 170, which is also the output level of phase demodulator 110. Correlation detector 520 calculates the correlation between the output of phase demodulator 110 and the output of adder 170, and controls the amount of attenuation of variable attenuator 180 so that this correlation is minimized. Variable attenuator 181 provided at the input terminal of adder 171 and to which the output of adder 170 is input, adjusts the input level to adder 171, which is also the output level of adder 170. Correlation detector 530 calculates the correlation between (a) the output of adder 170, and (b) the outputs of error-detection circuits $400_1$ and $400_2$, which extract the error components from the output of adder 171, and controls the amount of attenuation of variable attenuator 181 so that this correlation is minimized.

Next, an explanation will be given of the operation of the fourth embodiment of the invention. In FIG. 10, radio signals from a plurality of mobile terminals 1 and 2, which have been received by antenna 4 of radio base station 3, are converted to intermediate frequency signals by frequency converter FC, input to electrical-to-optical converter 5, and transmitted to central station 7 after passing through optical fiber transmission line 6. During this process, nonlinear distortion is produced by electrical-to-optical converter 5 of radio base station 3.

After the optical signal received at central station 7 has been converted to an electrical signal by optical-to-electrical converter 8, it is split by branch filter 82 between demodulation part $150_1$ which corresponds to mobile terminal 1 and demodulation part $150_2$ which corresponds to mobile terminal 2. The configuration of demodulation parts $150_1$ and $150_2$ are identical, and therefore the following explanation will focus on demodulation part $150_1$. The output of branch filter 82 is split into two by divider 9. One of the resulting two branches is input to phase demodulator 110, and the other is input to pseudo-distortion generator 11, which has nonlinear distortion characteristics on a par with electrical-to-optical converter 5 of radio base station 3. After the addition of distortion, the resulting signal is input to phase demodulator 112.

In phase demodulator 110, the input signal is resolved into in-phase and quadrature components on the basis of reference carrier signal 113, which has been recovered from this input signal itself. Next, using recovered clock signal 119 as the sampling signal, the in-phase and quadrature components of the output of phase demodulator 110 are respectively digitized in AD converters 120 and 121, which have ample quantization accuracy, whereupon quadrature signal aQ and in-phase signal aI are obtained.

Likewise, in phase demodulator 112 the input signal is resolved into in-phase and quadrature components on the basis of reference carrier signal 113, and clock signal 119 is used as the sampling signal for digitizing these components in AD converters 127 and 128 respectively, the converters having ample quantization accuracy, whereupon quadrature signal bQ and in-phase signal bI are obtained. In-phase signal aI, quadrature signal aQ, in-phase signal bI and quadrature signal bQ are input to distortion extraction part 129 where, by means of operations which will be described below, the desired signal components of these signals are suppressed and in-phase distortion signal dI and quadrature distortion signal dQ are extracted. Distortion extraction part 129 comprises variable attenuator 180 (which consists of bipolar variable attenuation elements 130–133); correlation detector 520; and adder 170 (which consists of adder units 135–138). The characteristics of bipolar variable attenuation elements 130–133 are similar to those illustrated in FIG. 5.

Figure 11:
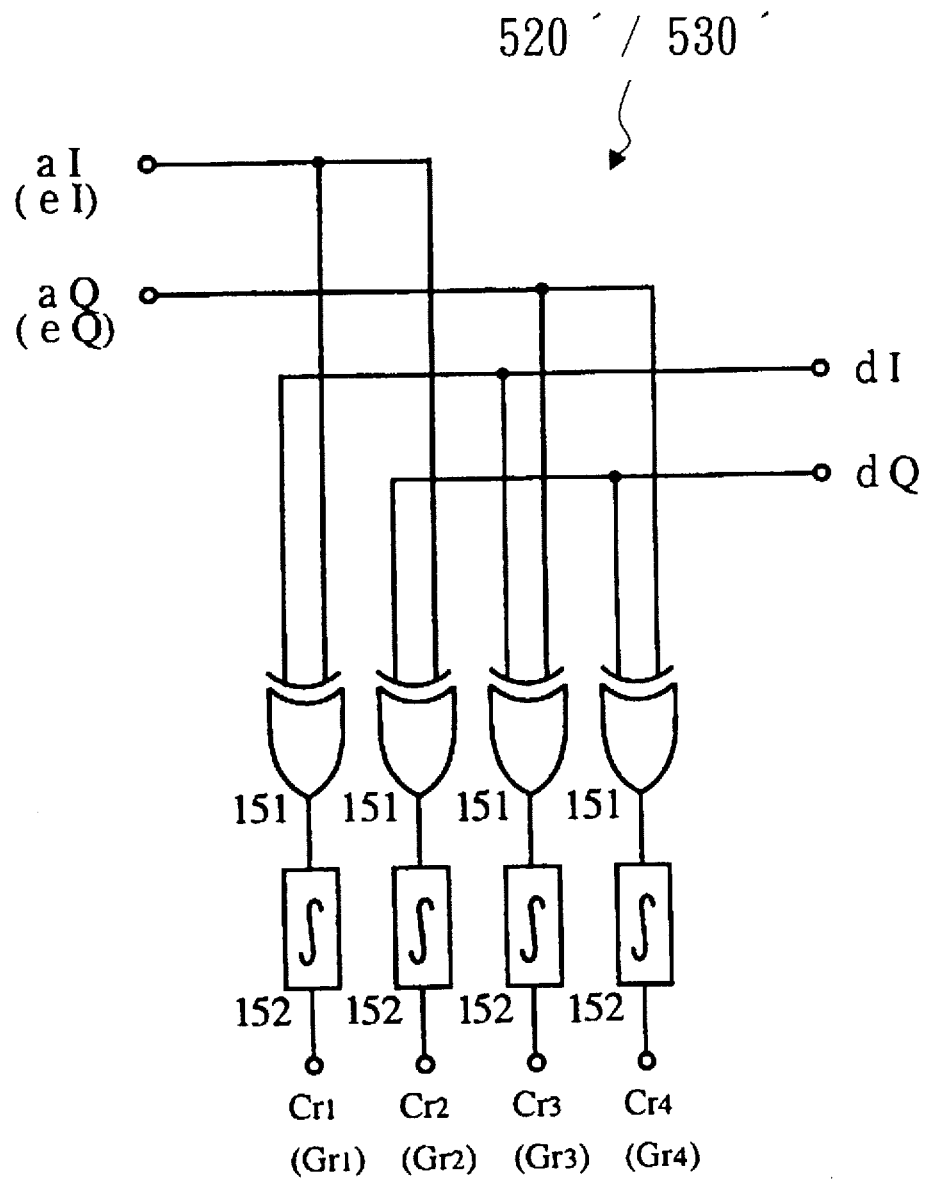
FIG. 11 is a block diagram of a correlation detector in the fourth embodiment of this invention.

FIG. 11 is a block diagram of correlation detectors 520 and 530. Correlation detectors 520 and 530 comprise exclusive-OR circuits 151 and integrating circuits 152, and employ these to detect correlations of the desired signal between (a) in-phase signal aI and quadrature signal aQ, and (b) in-phase distortion signal dI and quadrature distortion signal dQ. They then form control signals $Cr_1$–$Cr_4$ or $Gr_1$–$Gr_4$ so that these correlations are minimized. These control signals are supplied to bipolar variable attenuation elements 130–133 or 140–143, thereby providing feedback control.

In distortion extraction part 129 having the configuration described above, in-phase signal aI is first of all input to bipolar variable attenuation elements 130 and 132 and to correlation detector 520. It is then attenuated in bipolar variable attenuation elements 130 and 132 on the basis of control signals $Cr_1$ and $Cr_2$ that are output from correlation detector 520. Likewise, quadrature signal aQ is input to bipolar variable attenuation elements 131 and 133 and to correlation detector 520, and is then attenuated in bipolar variable attenuation elements 131 and 133 on the basis of control signals $Cr_3$ and $Cr_4$ which are output from correlation detector 520.

Next, after in-phase signal bI has been added in adder unit 135 to the output signal of bipolar variable attenuation element 130, it is added in adder unit 136 to the output signal of bipolar variable attenuation element 131. This means that the desired signal contained in in-phase signal bI is added at the same amplitude as, but with the opposite phase to, the desired signal contained in in-phase signal aI and quadrature signal aQ, with the result that the desired signal component is suppressed, and the in-phase distortion signal dI is extracted, output from adder unit 136, and supplied to correlation detector 520 and distortion compensation part 139.

Likewise, after quadrature signal bQ has been added in adder unit 137 to the output signal of bipolar variable attenuator element 132, it is added in adder unit 138 to the output signal of bipolar variable attenuator element 133. This means that the desired signal contained in quadrature signal bQ is added at the same amplitude as, but with the opposite phase to, the desired signal contained in in-phase signal aI and quadrature signal aQ, with the result that the desired signal component is suppressed, and the quadrature distortion signal dQ is extracted, output from adder unit 138, and supplied to correlation detector 520 and distortion compensation part 139.

Variable attenuator 180 uses four bipolar variable attenuation elements 130–133 to control the amplitudes of the in-phase and quadrature signals separately, and this is equivalent to it controlling the phase and amplitude of the complex signal comprising the in-phase and quadrature signals. In other words, variable attenuator 180 can be thought of as having the same function as phase and amplitude varying circuit 12 shown in FIG. 1.

Next, distortion compensation part 139 receives in-phase signal aI, quadrature signal aQ, in-phase distortion signal dI and quadrature distortion signal dQ, and by means of operations which will be described below, provides output in which the distortion component that has leaked into in-phase signal aI and quadrature signal aQ has been suppressed. Variable attenuator 181 (which consists of bipolar variable attenuation elements 140–143) and correlation detector 530 of distortion compensation part 139 have the same characteristics and configurations as the aforementioned variable attenuator 180 and correlation detector 520. Distortion compensation part 139 also has adder 171 which comprises adder units 145–148.

In distortion compensation part 139, in-phase distortion signal dI is first input to bipolar variable attenuation elements 141 and 143 and to correlation detector 530. It is then attenuated in bipolar variable attenuation elements 141 and 143 based on control signals $Gr_1$ and $Gr_3$, which are output from correlation detector 530. Likewise, quadrature distortion signal dQ is input to bipolar variable attenuation elements 140 and 142 and to correlation detector 530, and is then attenuated in bipolar variable attenuation elements 140 and 142 based on of control signals $Gr_2$ and $Gr_4$, which are output from correlation detector 530.

Next, after in-phase signal aI has been added in adder unit 145 to the output signal of bipolar variable attenuation element 140, it is added in adder unit 146 to the output signal of bipolar variable attenuation element 141. This means that the distortion component contained in in-phase signal aI is added at the same amplitude as, but with the opposite phase to, the distortion component contained in in-phase distortion signal dI and quadrature distortion signal dQ, with the result that the distortion component is suppressed. The in-phase error component eI contained in the output of adder unit 146 is output from error detection circuit $400_2$ and supplied to correlation detector 530.

Likewise, after quadrature signal aQ has been added in adder unit 147 to the output signal of bipolar variable attenuation element 142, it is added in adder unit 148 to the output signal of bipolar variable attenuation element 143. This means that the distortion component contained in quadrature signal aQ is added at the same amplitude as, but with the opposite phase to, the distortion component contained in in-phase distortion signal dI and quadrature distortion signal dQ, with the result that the distortion component is suppressed. The quadrature error signal eQ contained in the output of adder unit 148 is output from error detection circuit $400_1$ and supplied to correlation detector 530.

Correlation detector 530 detects correlations of the distortion component between in-phase distortion signal dI and quadrature distortion signal dQ, and in-phase error signal eI and quadrature error signal eQ, and forms control signals $Gr_1$–$Gr_4$ so that these correlations are minimized. These control signals are supplied to bipolar variable attenuation elements 140–143, thereby providing feedback control.

Variable attenuator 181 uses four bipolar variable attenuation elements 140–143 to control the amplitudes of the in-phase and quadrature signals separately. This is equivalent to controlling the phase and amplitude of the complex signal comprising the in-phase and quadrature signals. In other words, variable attenuator 181 can be thought of as having the same function as phase and amplitude varying circuit 13 shown in FIG. 1.

(FIFTH EMBODIMENT)

Figure 12:
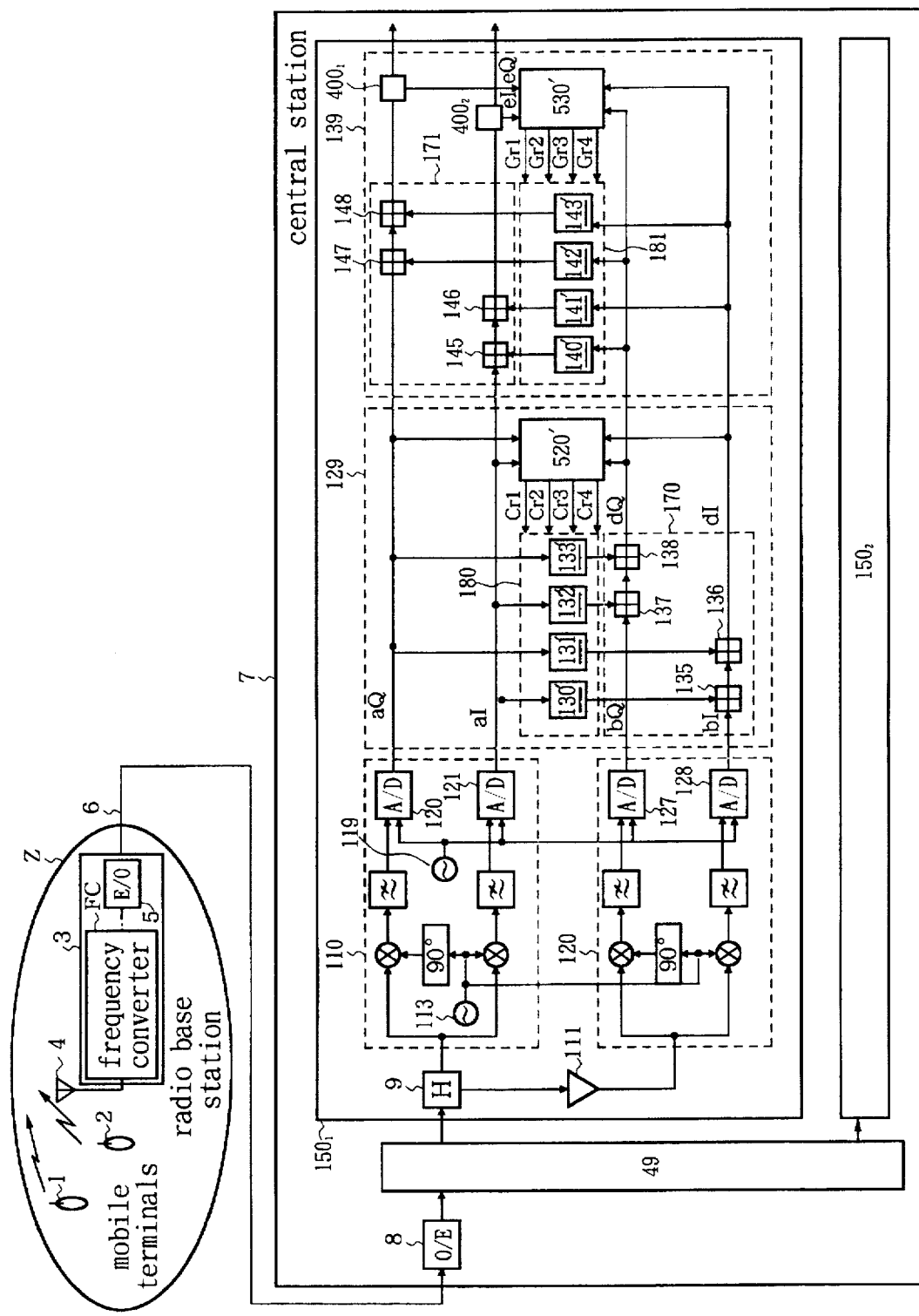
FIG. 12 is a block diagram of a fifth embodiment of this invention.

Next, a fifth embodiment of this invention will be explained with reference to FIG. 12, which is a block diagram of said fifth embodiment. The fifth embodiment differs from the fourth embodiment illustrated in FIG. 10 in that in distortion extraction part 129 and distortion compensation part 139, whereas the fourth embodiment used variable attenuators 180 and 181 comprising bipolar variable attenuation elements 130–133 and 140–143, the fifth embodiment uses digital transversal filters 130'–133' and and 140'–143'. The fifth embodiment also differs from the fourth embodiment in that it uses tap weighting control circuits 520' and 530' to weight the taps of transversal filters 130'–133' and 140'–143'.

Figure 13:
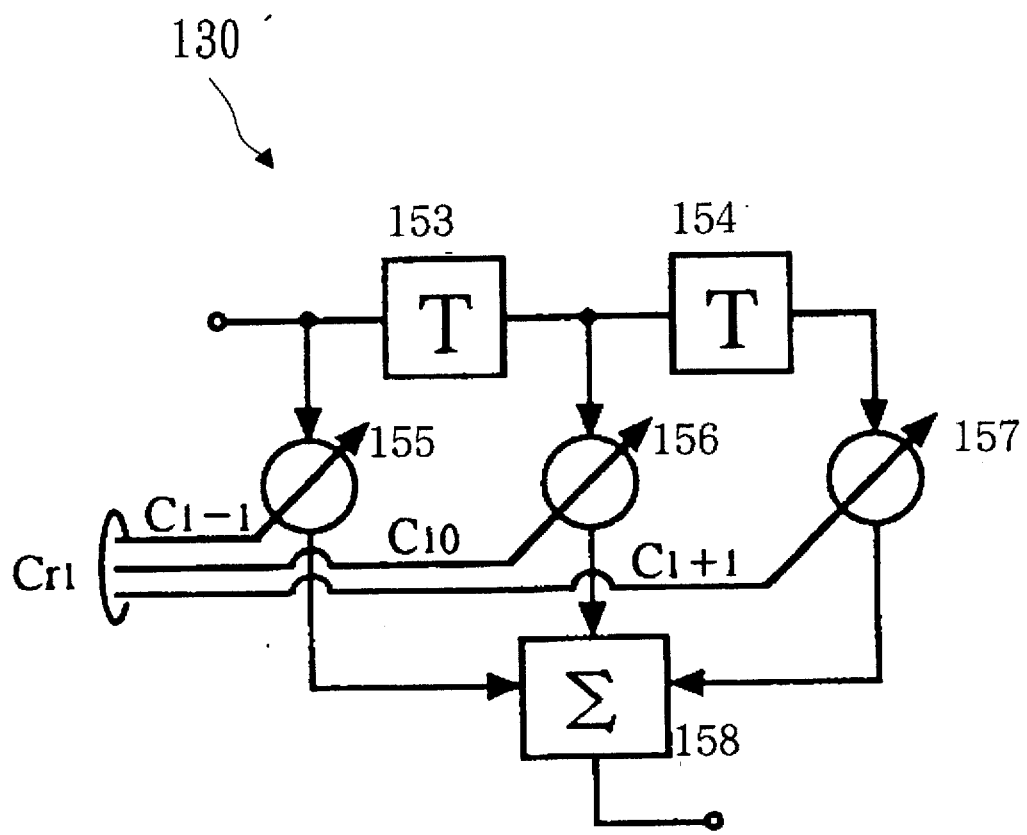
FIG. 13 is a block diagram of a transversal filter in the fifth embodiment of this invention.

FIG. 13 is a block diagram of one of transversal filters 130'–133' and 140'–143'. Transversal filter 130' (showing, byway of example, the case where there are three taps) comprises: delay elements 153 and 154, each of which causes the input digital signal to be delayed by a clock period T; bipolar variable attenuation elements 155–157; and adder unit 158. Digital signals that are input to transversal filter 130' are supplied to delay element 153 and bipolar variable attenuation element 155. The output of delay element 153 is supplied to delay element 154 and bipolar variable attenuation element 156. The output of delay element 154 is supplied to bipolar variable attenuation element 157. Bipolar variable attenuation elements 155–157 attenuate the input digital signals based on control signal $Cr_1$ (comprising C1–1, C10 and C1+1) which is output from tap weighting control circuit 520'. Adder unit 158 adds the respective digital signals that are output from bipolar variable attenuation elements 155–157.

Figure 14:
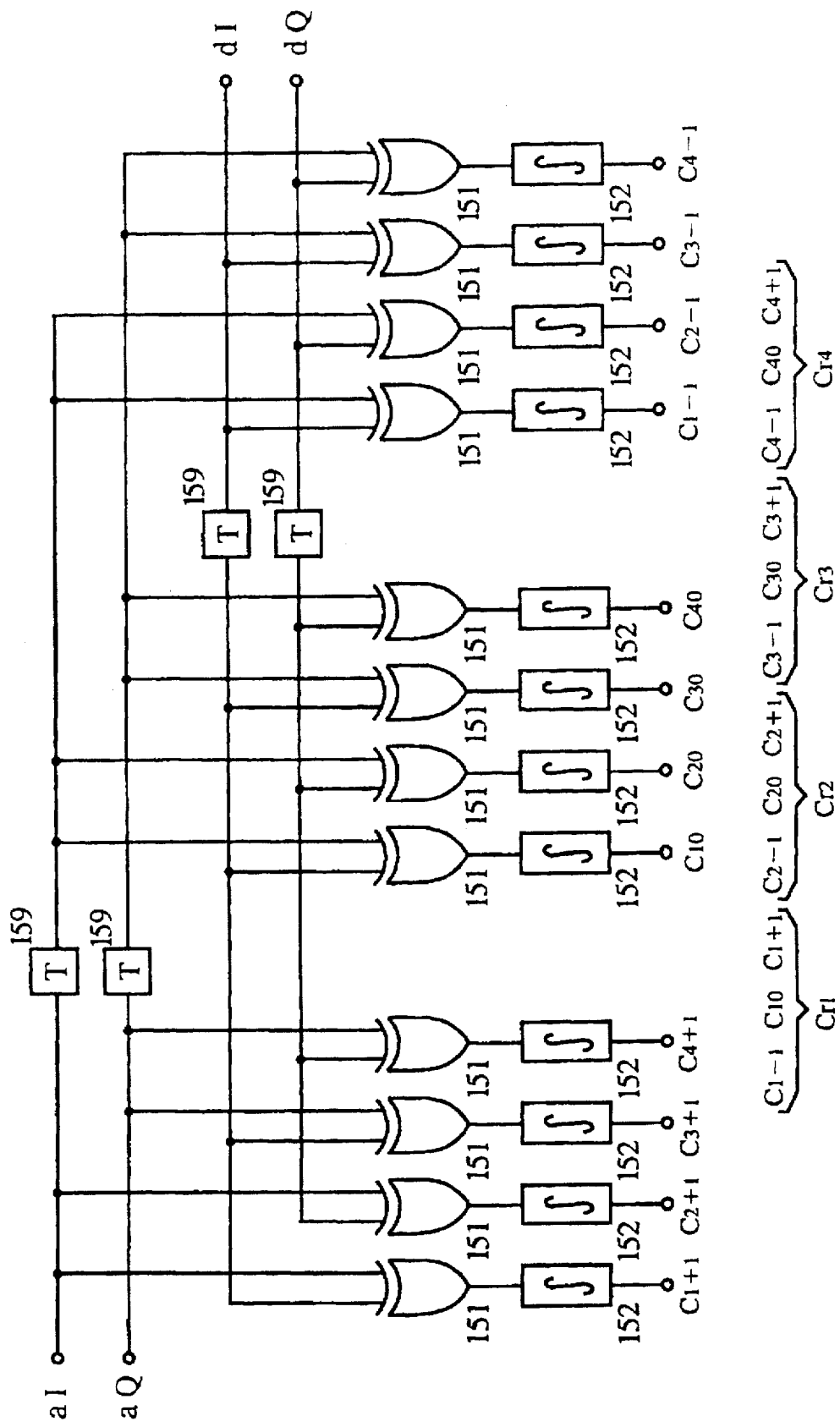
FIG. 14 is a block diagram of a correlation detector in the fifth embodiment of this invention.

FIG. 14 is a block diagram of tap weighting control circuit 520', which comprises delay circuits 159 with clock period T, exclusive-OR circuits 151, and integrating circuits 152. Tap weighting control circuit 520' aligns the timing of in-phase signal aI and quadrature signal aQ, and the timing of in-phase distortion signal dI and quadrature distortion signal dQ, by causing each of these signals to be delayed by a clock period T in a delay circuit 159. Tap weighting control circuit 520' also uses exclusive-OR circuits 151 and integrating circuits 152 to detect correlations of the desired signal, and forms control signals $Cr_1$–$Cr_4$ so that these correlations are minimized. It then supplies these control signals to transversal filters 130'–133', thereby providing feedback control.

In FIG. 14, control signals C1–1, C10 and C1+1 together comprise control signal $Cr_1$. Likewise, control signals C2–1, C20 and C2+1 together comprise control signal $Cr_2$; control signals C3–1, C30 and C3+1 together comprise control signal $Cr_3$; and control signals C4–1, C40 and C4+1 together comprise control signal $Cr_4$.

The result of using, in distortion extraction part 129, transversal filters 130'–133' and tap weighting control circuit 520' with the configurations described above, is that even when the frequency characteristics of the desired signal have changed due to passage through pseudo-distortion generator 11, the desired signal can be suppressed and the distortion component extracted, because transversal filters 130'–133' can change the frequency characteristics of the input in-phase signal aI and quadrature signal aQ, and make these signals equivalent to in-phase signal bI and quadrature signal bQ.

Moreover, the result of using, in distortion compensation part 139, transversal filters 140'–143' and tap weighting control circuit 530' with the same configurations as described above, is that even when the frequency characteristics of in-phase distortion signal dI and quadrature distortion signal dQ, which have been extracted by distortion extraction part 129, are different from the frequency characteristics of the distortion component contained in in-phase signal aI and quadrature signal aQ, they can be made equivalent by transversal filters 140'–143', so that the distortion component can be eliminated.

(SIXTH EMBODIMENT)

Figure 15:
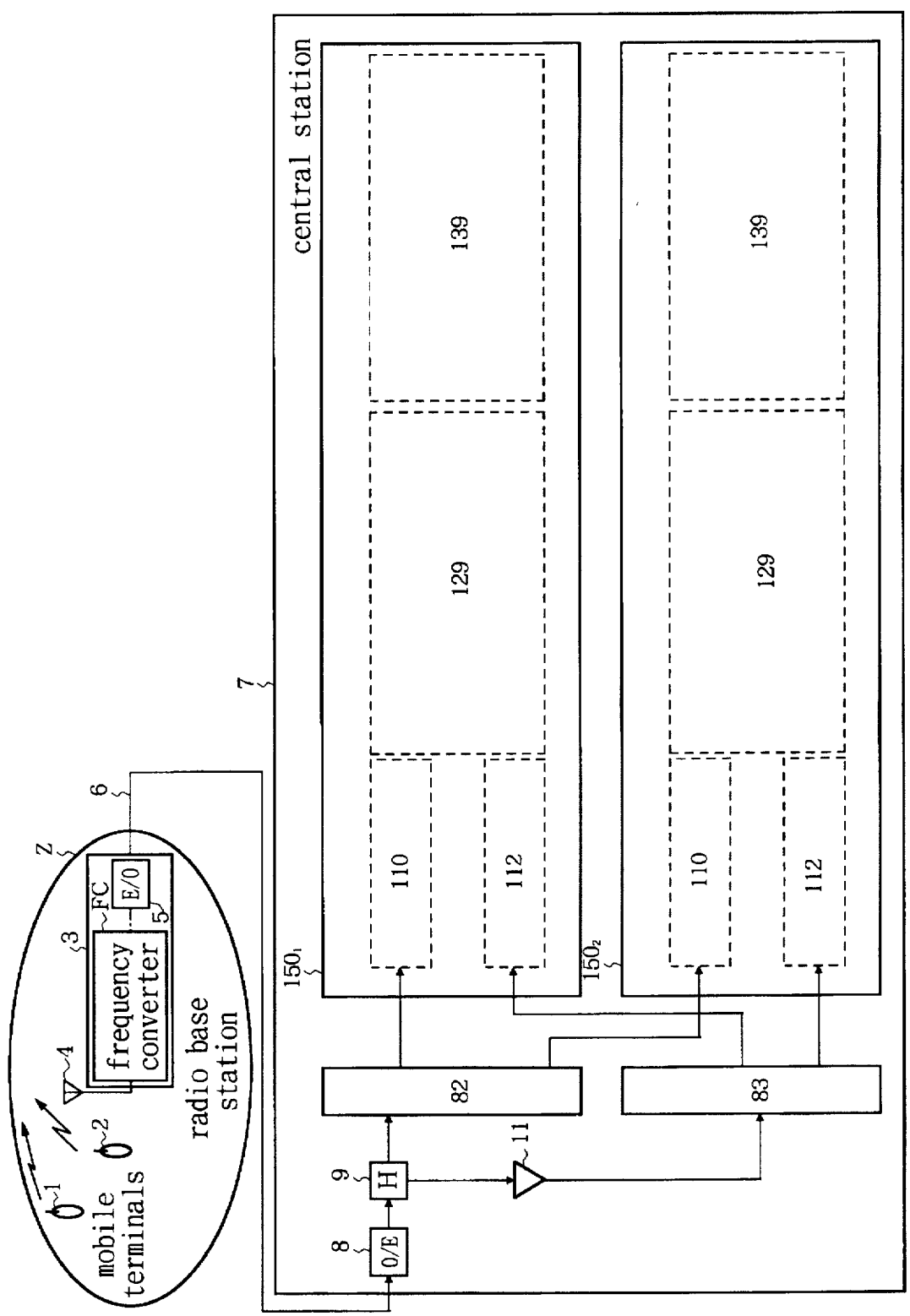
FIG. 15 is a block diagram of a sixth embodiment of this invention.
Figure 16:
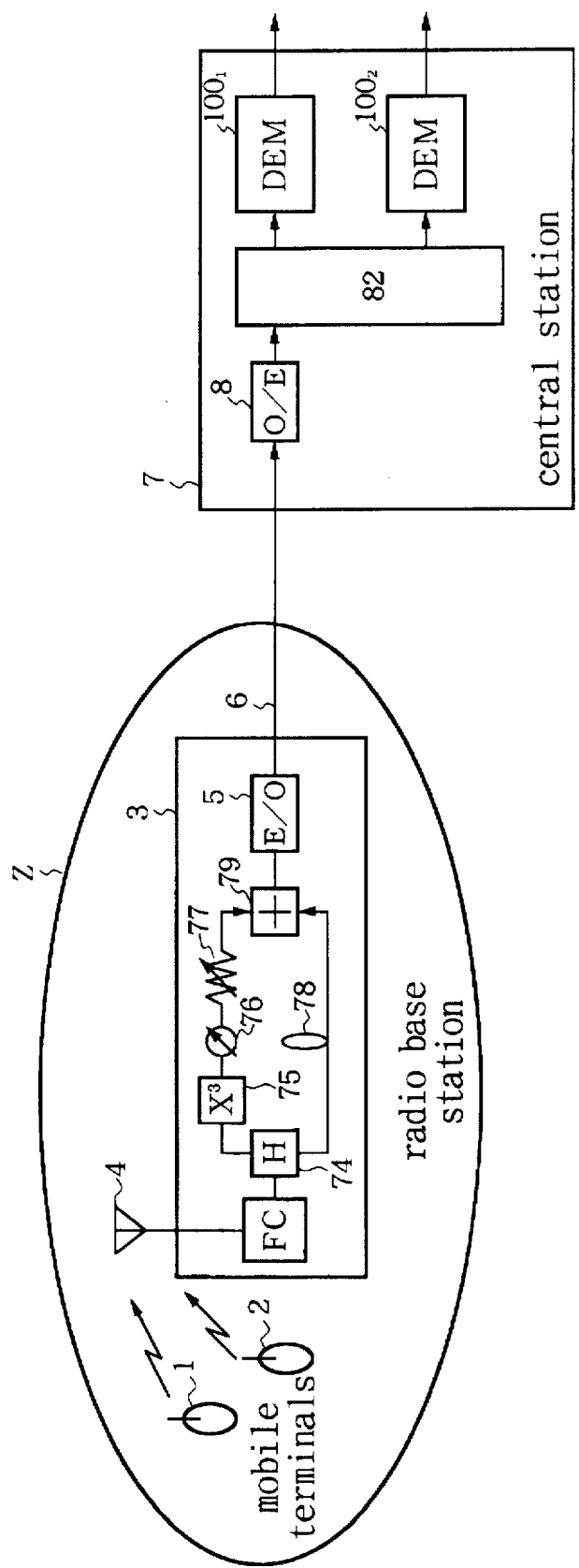
FIG. 16 is a block diagram of a conventional device.

Next, a sixth embodiment of this invention will be explained with reference to FIG. 15, which is a block diagram of the sixth embodiment. This sixth embodiment differs from the fourth embodiment illustrated in FIG. 10 in that divider 9 is positioned before branch filter 82, and the signal to which pseudo-distortion has been added by pseudo-distortion generator 11, having been branched off by divider 9, is split by branch filter 83 for the pseudo-distortion into a path to demodulation part $150_1$ which corresponds to mobile terminal 1, and a path to demodulation part $150_2$ which corresponds to mobile terminal 2. In the fourth embodiment of this invention, the pseudo-distortion was produced in two paths, whereas a configuration according to this sixth embodiment of the invention enables the output of pseudo-distortion generator 11 to be shared by two paths.

While the invention has been described in connection with what is presently considered to be the most practical and preferred embodiments, it is to be understood that the invention is not to be limited to the disclosed embodiments, but on the contrary is intended to cover various modifications and equivalent arrangements included within the spirit and scope of the appended claims.

Thus, it is to be understood that variations in the particular configuration employed can be made without departing from the novel aspects of this invention as defined in the claims.

What is claimed is:

1. A distortion compensator comprising:
   a pseudo-distortion generator receiving a digitally multiplexed quadrature phase modulated intermediate frequency signal containing odd order distortion, said pseudo-distortion generator outputting a signal equivalent to said odd order distortion;
   a first phase and amplitude varying circuit receiving said intermediate frequency signal;
   a first adder which essentially subtracts an output of said first phase and amplitude varying circuit from said signal output from said pseudo-distortion generator;
   a second phase and amplitude varying circuit receiving an output of said first adder;
   a second adder which adds an output of said second phase and amplitude varying circuit and said intermediate frequency signal so as to eliminate said odd order distortion;
   an error detection circuit which extracts an error component from an output of said second adder;
   first correlation detector which calculates a first correlation between said intermediate frequency signal and said output of said first adder, and which controls an amount of phase shift and an amplitude of said first phase and amplitude, varying circuit so that said first Correlation is minimized; and
   a second correlation detector which calculates a second correlation between said output of said first adder and an error component output from said error detection circuit, and which controls an amount of phase shift and an amplitude of said second phase and amplitude varying circuit so that said second correlation is minimized.

2. A distortion compensator as set forth in claim 1, further comprising:
   a first phase demodulator receiving said output of said second adder;
   a second phase demodulator receiving said intermediate frequency signal; and
   a third phase demodulator receiving said output of said first adder,
   wherein said first correlation detector comprises means for calculating a third correlation between an output of said third phase demodulator and an output of said second phase demodulator, and which controls an amount of phase shift and an amplitude of said first phase and amplitude varying circuit so said third correlation is minimized; and
   said second correlation detector comprising means for calculation a fourth correlation between said output of said third phase demodulator and said output of said first phase demodulator, and which controls an amount of phase shift and an amplitude of said second phase and amplitude varying circuit so that said fourth correlation is minimized.

3. Distortion compensator as set forth in claim 2, wherein at least one of said first and said second phase and amplitude varying circuits comprises a transversal filter.

4. Distortion compensator as set forth in claim 1, further comprising a first phase demodulator which receives said intermediate frequency signal, and which outputs signals to said first phase and amplitude varying circuit and said second adder, and wherein a second phase demodulator is provided between said pseudo-distortion generator and said first adder.

5. Distortion compensator as set forth in claim 4, wherein at least one of said first and said phase and amplitude varying circuits comprises a transversal filter.

6. A receiving device comprising:
   a branch filter receiving a first intermediate frequency signal comprising digitally multiplexed quadrature phase modulated signals which contain odd order distortion that have been frequency multiplexed onto a plurality of carriers, said branch filter splitting said first intermediate frequency signal into digitally multiplexed quadrature phase modulated second intermediate frequency signals corresponding to each carrier; and
   a plurality of distortion compensators operatively connected to said branch filter, wherein one distortion compensator is provided for each carrier, each of said plurality of distortion compensators comprising:
      a pseudo-distortion generator receiving a third intermediate frequency signal corresponding to one of said second intermediate frequency signals, said pseudo distortion generator outputting a signal equivalent to said odd order distortion;
      a first phase and amplitude varying circuit receiving said third intermediate frequency signal;
   a first adder which essentially subtracts an output of said first phase and amplitude varying circuit from said signal output from said pseudo-distortion generator;
   a second phase and amplitude varying circuit receiving an output of said first adder;
   a second adder which adds an output of said second phase and amplitude varying circuit and said third intermediate frequency signal so as to eliminate said odd order distortion;
   an error detection circuit which extracts an error component from an output of said second adder;
   first correlation detector which calculates a first correlation between said third intermediate frequency signal and said output of said first adder, and which controls an amount of phase shift and an amplitude of said first phase and amplitude varying circuit so that said first correlation is minimized; and
   a second correlation detector which calculates a second correlation between said output of said first adder and an error component output from said error detection circuit, and which controls an amount of phase shift and an amplitude of said second phase and amplitude varying circuit so that said second correlation is minimized.

7. A receiving device comprising:
   a pseudo-distortion generator receiving a first intermediate frequency signal comprising digitally multiplexed quadrature phase modulated signals which contain odd order distortion that have been frequency multiplexed onto a plurality of carriers, said pseudo-distortion generator outputting a signal equivalent to said odd order distortion;
   a branch filter also receiving said first intermediate frequency signal and splitting said first intermediate frequency signal into digitally multiplexed quadrature phase modulated second intermediate frequency signals corresponding to each carrier; and
   a plurality of distortion compensators, wherein one distortion compensator is provided for each carrier, each of said plurality of distortion compensators comprising:

a first phase and amplitude varying circuit receiving a third intermediate frequency signal corresponding to one of said second intermediate frequency signals;

a first adder which essentially subtracts an output of said first phase and amplitude varying circuit from said signal output from said pseudo-distortion generator;

a second phase and amplitude varying circuit receiving an output of said first adder;

a second adder which adds an output of said second phase and amplitude varying circuit and said third intermediate frequency signal so as to eliminate said odd order distortion;

an error detection circuit which extracts an error component from an output of said second adder;

first correlation detector which calculates a first correlation between said third intermediate frequency signal and said output of said first adder, and which controls an amount of phase shift and an amplitude of said first phase and amplitude varying circuit so that said first correlation is minimized; and a second correlation detector which calculates a second correlation between said output of said first adder and an error component output from said error detection circuit, and which controls an amount of phase shift and an amplitude of said second phase and amplitude varying circuit so that said second correlation is minimized.

8. A communication system comprising:

a central station comprising:

an optical-to-electrical converter that receives an optical multiplexed signal and outputs an electrical signal as a first intermediate frequency signal comprising digitally multiplexed quadrature phase modulated signals which contain odd order distortion that have been frequency multiplexed onto a plurality of carriers;

a branch filter receiving said first intermediate frequency signal and splitting said first intermediate frequency signal into digitally multiplexed quadrature phase modulated second intermediate frequency signals corresponding to each carrier; and a plurality of distortion compensators operatively connected to said branch filter, wherein one distortion compensator is provided for each carrier, each of said plurality of distortion compensators comprising:

a pseudo-distortion generator receiving said a third intermediate frequency signal corresponding to one of said second intermediate frequency signals, said pseudo-distortion generator outputting a signal equivalent to said odd order distortion;

a first phase and amplitude varying circuit receiving said third intermediate frequency signal;

a first adder which essentially subtracts an output of said first phase and amplitude varying circuit from said signal output from said pseudo-distortion generator;

a second phase and amplitude varying circuit receiving an output of said first adder;

a second adder which adds an output of said second phase and amplitude varying circuit and said third intermediate frequency signal so as to eliminate said odd order distortion;

an error detection circuit which extracts an error component from an output of said second adder;

first correlation detector which calculates a first correlation between said third intermediate frequency signal and said output of said first adder, and which controls an amount of phase shift and an amplitude of said first phase and amplitude varying circuit so that said first correlation is minimized; and a second correlation detector which calculates a second correlation between said output of said first adder and an error component output from said error detection circuit, and which controls an amount of phase shift and an amplitude of said second phase and amplitude varying circuit so that said second correlation is minimized.

9. A radio communication system as set forth in claim 8, further comprising:

a plurality of mobile terminals;

a radio base station receiving radio signals from said mobile terminals, said radio base station comprising:

a frequency converter receiving said radio signals received from said mobile terminals, and an electrical-to-optical converter that converts an output of said frequency converter to optical signals, wherein said optical signal output from said electrical-to-optical converter is connected, by means of an optical transmission line, to an input of said optical-to-electrical converter in said a central station.

* * * * *